(12) United States Patent
Petrov et al.

(10) Patent No.: US 7,525,091 B2
(45) Date of Patent: Apr. 28, 2009

(54) CHARGED PARTICLE BEAM SYSTEM AND A METHOD FOR INSPECTING A SAMPLE

(75) Inventors: Igor Petrov, Holon (IL); Guy Eitan, HaOranim (IL); Albert Karabekov, Ashdod (IL)

(73) Assignee: Applied Materials, Israel, Ltd., Rehovot (IL)

( * ) Notice: Subject to any disclaimer, the term of this patent is extended or adjusted under 35 U.S.C. 154(b) by 177 days.

(21) Appl. No.: 11/508,578

(22) Filed: Aug. 23, 2006

(65) Prior Publication Data

US 2008/0073531 A1 Mar. 27, 2008

(51) Int. Cl.
*H01J 37/28* (2006.01)
(52) U.S. Cl. .................................... 250/310
(58) Field of Classification Search .............. 250/310
See application file for complete search history.

(56) References Cited

U.S. PATENT DOCUMENTS

| | | | | |
|---|---|---|---|---|
| 5,789,748 A * | 8/1998 | Liu et al. | .............. | 250/310 |
| 6,977,375 B2 * | 12/2005 | Yin et al. | .............. | 250/310 |
| 7,034,297 B2 * | 4/2006 | Petrov et al. | .............. | 250/310 |
| 7,122,795 B2 * | 10/2006 | Parker | .............. | 250/310 |

* cited by examiner

*Primary Examiner*—Kiet T Nguyen
(74) *Attorney, Agent, or Firm*—Tarek N. Fahmi

(57) ABSTRACT

A method and system for inspecting an inspected object. The system includes: a detector adapted to detect charged particles scattered from a sample; a magnetic lens adapted to generate a magnetic field such as to direct a charge particle beam towards a sample and an first electrode positioned very close to an inspected object, wherein the first electrode comprises a very thin portion that defines a narrow aperture through which the charged particle beam can propagate.

23 Claims, 3 Drawing Sheets

CHARGED PARTICLE BEAM SYSTEM AND A METHOD FOR INSPECTING A SAMPLE

FIELD OF THE INVENTION

The invention relates to methods and systems for illuminating a sample with a charged particle beam and especially to scanning electron microscopes.

BACKGROUND OF THE INVENTION

Charged particle beam columns are typically employed in scanning electron microscopy (SEM), which is a known technique widely used in the manufacture of semiconductor wafers, being utilized in a CD metrology tool, the so-called CD-SEM (critical dimension scanning electron microscope), and a defect review SEM (DF-SEM). In SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

Various prior art CD-SEMs and method for measuring critical dimensions are illustrated in the following U.S. patent applications which are incorporated herein by reference: U.S. patent application publication number 20030015699 of Su, titled "Integrated critical dimension control for semiconductor device manufacturing"; U.S. patent application publication number 20050048654 of Wu, titled "Method of evaluating reticle pattern overlay registration"; U.S. patent application publication number 20040173746 of Petrov, et al., titled "Method and system for use in the monitoring of samples with a charged particles beam"; U.S. patent application publication number 20040056207 of Petrov, et al., titled "Deflection method and system for use in a charged particle beam column"; U.S. patent application publication number 20030218133 of Petrov, et al., titled "Charged particle beam column and method for directing a charged particle beam", and U.S. patent application publication number 20030209667 of Petrov, et al., titled "Charged particle beam apparatus and method for inspecting samples.

SEM includes such main constructional parts as an electron beam source (formed with a small tip called "electron gun"), an electron beam column, and a detector unit. The detector unit may be located outside the path of the primary beam propagation through the column, or may be located in the path of the primary beam (the so-called "in-column" or "in-lens" detector). The electron beam column includes, inter alia, a beam focusing/deflecting arrangement formed by a lens assembly and a deflector assembly. The deflection of the primary beam provides for scanning the beam within a scan area on the sample, and also for adjusting incidence of the primary beam onto the sample (an angle of incidence and/or beam shift), as well as directing the secondary beam to the detector.

In SEM, in order to reduce the "spot" size of the electron beam (up to nanometers) and thus increase the image resolution, a highly accelerated electron beam is typically produced using accelerating voltages of several tens of kilovolts and more. Specifically, the electron optic elements are more effective (i.e. produce smaller aberrations) when the electrons are accelerated to high kinetic energy. However, in order to avoid damaging a sample (resist structure and integrated circuit) that might be caused by such a highly energized electron beam, the electron beam is decelerated just prior to impinging onto the sample. Deceleration of the electrons can generally be accomplished by selectively creating a potential difference between the pole piece of a magnetic objective lens and the sample. Alternatively, the same effect can be achieved by actually introducing electrodes having selective potential applied thereto.

Some systems of the kind specified utilize the lens assembly in the form of a combination of a magnetic objective lens and an electrostatic lens, the so-called "compound magnetic-electrostatic lens" (e.g., EP 1238405 and EP 1045425, both assigned to the assignee of the present application). The electrostatic part of the compound magnetic-electrostatic lens is an electrostatic retarding lens (with respect to the primary charged particle beam), and has electrodes held at different potentials, one of the two electrodes being formed by an anode (which is typically in the form of a tube defining a primary beam drift space for the primary beam propagation to the sample, such as anode 11 of FIG. 2-7) arranged within a magnetic objective lens along its optical axis, and the other electrode being a metallic cap provided below the magnetic objective lens. The sample actually presents the third electrode of the electrostatic lens. The electric field created by the electrostatic lens in the vicinity of the sample appropriately decelerates the primary beam and also facilitates the extraction of secondary charged particles from the sample. U.S. Pat. No. 5,780,859 of Feuerbaym et al., which is incorporated herein by reference, describes a prior art electrostatic-magnetic lens arrangement.

Various optical characteristics of the SEM relate to the working distance between the SEM and the sample. The working distance should be large enough to guarantee that the wafer and the SEM do not tough each other during the scanning of the wafer but on the other hand larger working distances result in lower resolution as well as increased aberrations.

In addition, larger working distances require larger holes/apertures, thus relatively large amount of electrostatic field leaks through the aperture and can reduce the SEM resolution and accuracy.

There is a need to provide an efficient charged particle beam system and a method for inspecting wafers.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE INVENTION

Figure 1:
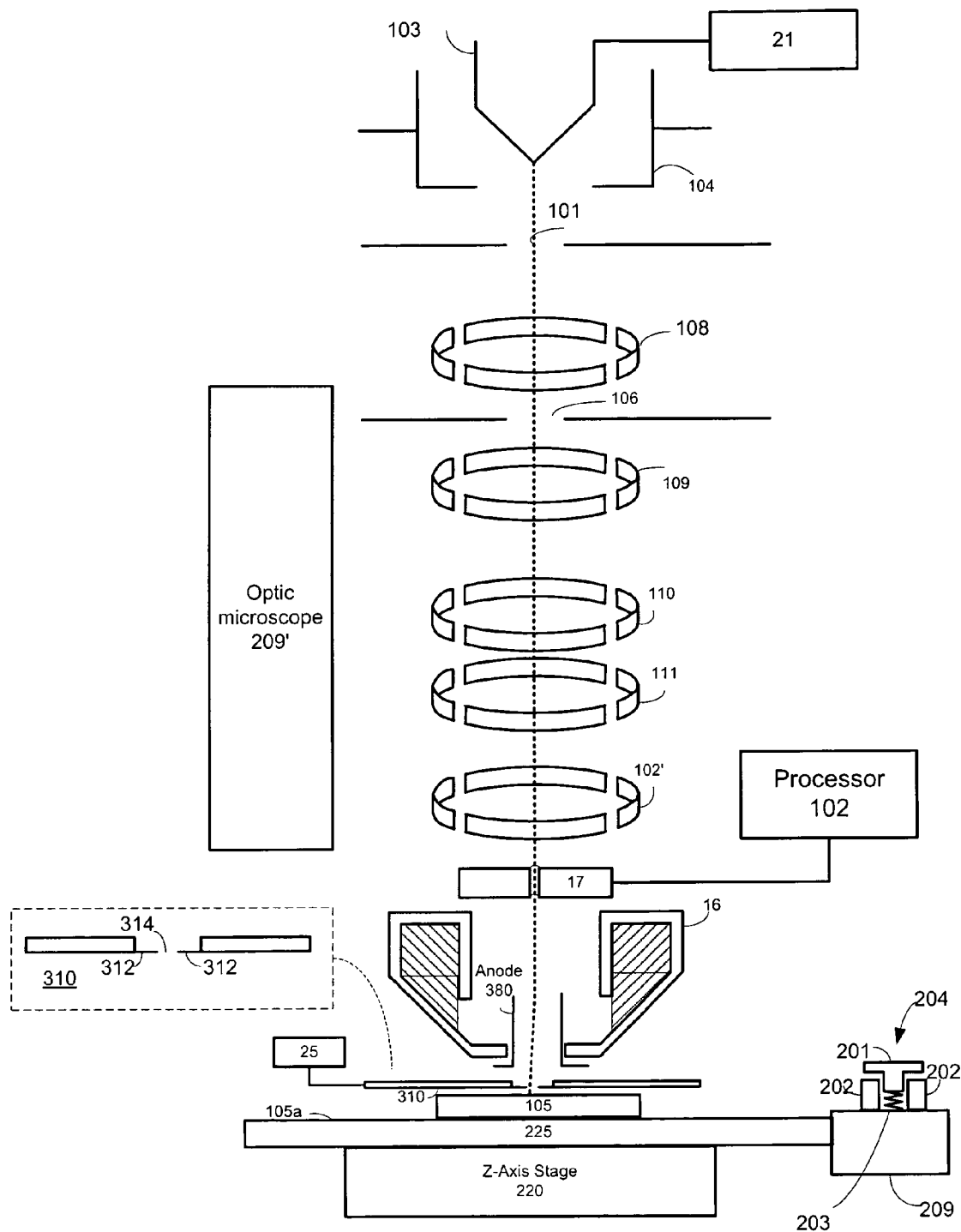
FIG. 1 schematically illustrates a system according to an embodiment of the invention.

The following figures refer to certain SEM. It is noted that this configuration, and especially that described in FIG. 1 are provided as a non-limiting example. The invention can be applied in other SEMs and in SEMs that have different configurations. It can also be applied to charged particle beams that differ from electron beams. This may include ion beams.

FIG. 1 illustrates system 100 according to an embodiment of the invention. System 100 includes an electron gun 103 emitting an electron beam 101, which is accelerated by the anode 104. The objective lens 16 focuses the electron beam on the specimen surface 105a. The beam is scanned over the specimen using the scanning deflection unit 102'. An alignment of the beam to the aperture 106 or a desired optical axis respectively can be achieved by the deflection units 108 to 111. As a deflection unit coils, electrostatic modules in the form of charged plates or a combination of coils and electrostatic deflectors can be used. Conveniently, at least one deflection coil is positioned between the objective lens and the sample.

It is noted that according to other embodiments of the invention a scan deflector is located between the in-lens detector 17 and the sample.

In-lens detector 17 is able to detect secondary and backscattering electrons that escape from the specimen 105 at a variety of angles. Measurements of scattered or secondary electrons from a specimen can be conducted with detectors in the form of scintillators connected to photomultiplier tubes or the like. Since the way of measuring the signals does not influence the inventive idea in general, this is not to be understood as limiting the invention. It is noted that the SEM may include, additionally or alternatively detectors.

Detection signals are processed by a processing unit 102 that may have image processing capabilities and is able to process the detection signals in various manners. A typical processing scheme includes generating a waveform that reflects the amplitude of the detection signal versus the scan direction. The waveform is further processed to determine locations of at least one edge, and other cross sectional features of inspected structural elements.

The different parts of the system are connected to corresponding supply units (such as high voltage supply unit 21) that are controlled by various control units, most of them are omitted from the figure for simplifying the explanation. The control units may determine the current supplied to a certain part, as well as the voltage.

System 100 includes a double deflection system that includes deflection units 110 and 111. Thus, the beam tilt introduced in the first deflection unit 110, can be corrected for in the second deflection unit 111. Due to this double deflection system, the electron beam can be shifted in one direction without introducing a beam tilt of the electron beam with respect to the optical axis.

As mentioned above, the tilt can, additionally or alternatively, performed below (downstream direction) of the objective lens.

System 100 also includes first electrode 310 that can be positioned very close to an inspected object (such as wafer 105), wherein first electrode 310 includes a very thin portion 312 that defines a narrow aperture 314 through which the charged particle beam can propagate.

The very thin portion 312 can be positioned near wafers that are relatively flat. Relatively flat wafers are wafers that are characterized by upper surface height deviations of less than 0.5 mm. A wafer 105 can flattened once placed on electrostatic chucks 225

Height target 204 is supported by mechanical element 209 that includes a movable element 201, a spring 203 and two supporting elements 202. Movable element 201 can loosely move along an imaginary Z-axis such that when the height target 204 is lifted (by Z-axis stage 220 and touches first electrode 310 it does not damage first electrode 310, especially in view to a possible limited accuracy of the Z-axis.

System 100 also includes optical microscope 209'.

In system 100 the narrow aperture 314 reduces the leakage of electrostatic field via the aperture 314 thus allowing to reduce the working distance. That do possible to reduce the working distance. The leakage reduction as well as shorter working distance reduce the chromatic aberration and the inventors gained above 20% improvement in resolution when low energy electron beams. The reduction in electrostatic field leakage is also very useful when low energy electron beams are directed towards the inspected object. The reduced leakage reduces the distortion of the low energy electron beam and approve the accuracy of the system.

The reduced aperture also can improve the collection efficiency of in-lens detector 17.

According to another embodiment of the invention the working distance is measured with high accuracy, after performing a calibration process better described in the following figures. This can include obtaining an image of the inner side of the cap (near the very thin portion that defines the narrow aperture) by defining a large field of view (or by beam shift coils) and then storing a first value (OLC1) of an objective lens current (OLC) that that passes through objective lens 16. This first value (OLC1) can help to determine the working distance. The calibration process then continues by focusing onto two surfaces that the distance between them is well known (and highly accurate) and measuring as well as storing a second value (OLC2) and a third value (OLC3) of the objective lens current OLC. The three OCL values (OLC1, OLC2 and OLC3) are used to calculate the relationship between the distance (z-axis) between the objective lens 16 and the objective lens current.

This calculated relationship can allow to determine the working distance, especially as the distance of the objective lens to the thin portion is known and the current of the objective lens once focused onto a wafer is measured.

Figure 2:
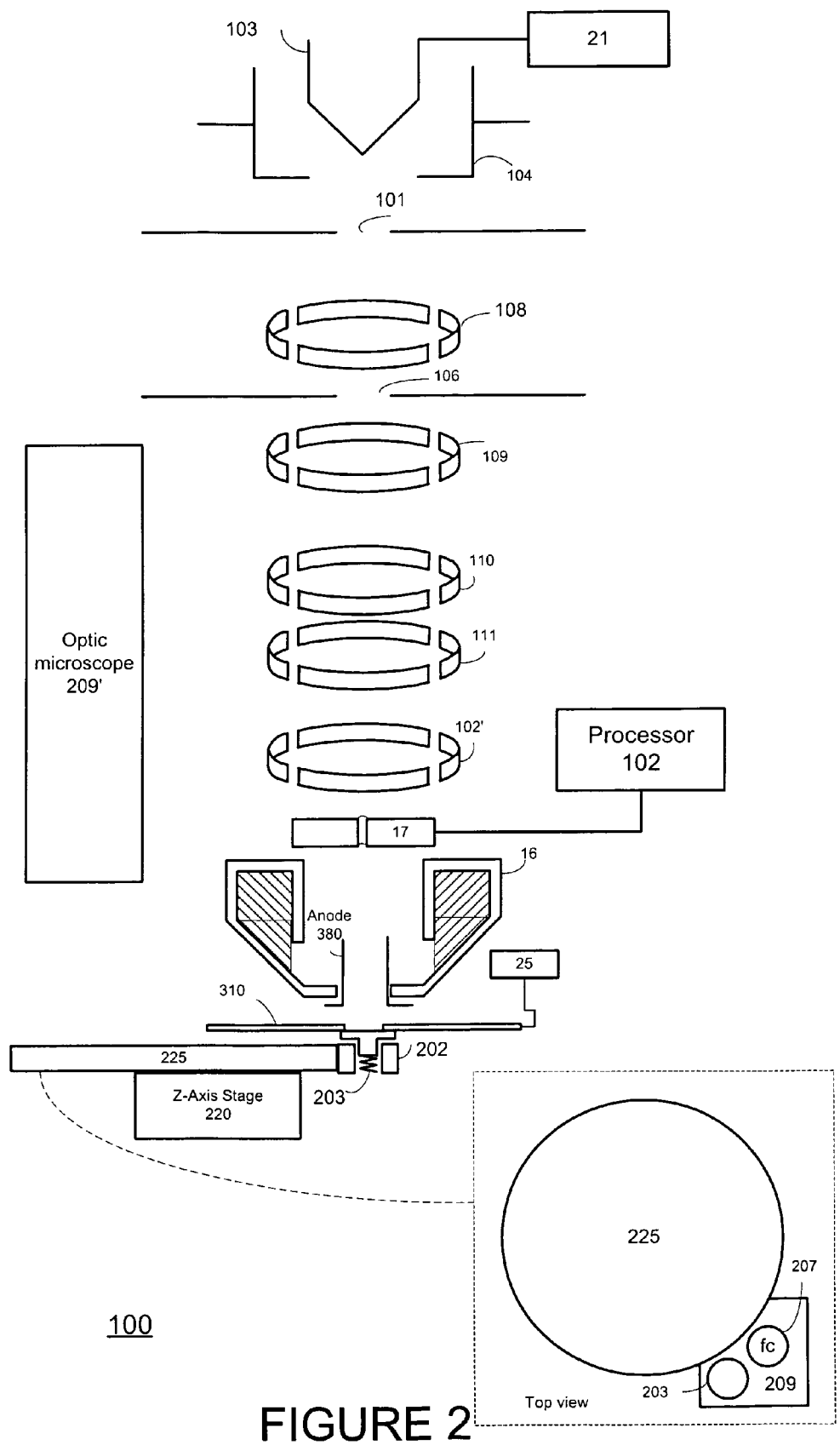
FIG. 2 illustrates a system 100 according to various embodiments of the invention.

FIG. 2 illustrates system 100 according to an embodiment of the invention. FIG. 2 also includes a top view of circular chuck 225 as well as height target 204 according to an embodiment of the invention.

The contact between first electrode 310 and height target 240 can be determined by closing a loop and electronically determining that the loop is closed. For example, the height target 204 can be grounded and a current/voltage meter or even a ohm-meter can be used to detect when the first electrode 310 is being grounded.

According to an embodiment of the invention the height calibration can include altering the height of the height target 204 until a contact is formed, slightly lifting the height target 204 until a substantial contact is formed between height target 204 and the first electrode 310, and then lowering the height target by predefined value using z-axis stage (1 um accuracy) and focusing on top surface of the height target Using OLC current. This OLC value will define a desired working distance. At this point the height target can be removed from the system and wafer can be loaded and z-axis stage can be moved in order to determine the proper working distance while the image will be focused at the saved OLC value.

According to an embodiment of the invention the movable portion of height target can only move in parallel to the surface of the height target (for example by moving it along multiple vertical axes) thus there is no need to slightly lift the height target to ensure that the contact is parallel.

Conveniently, the height target 304 is positioned above the wafer surface while measuring working distance.

According to yet another embodiment of the invention the height calibration process includes installing the height target slightly above (about 1 mm) the chuck, pumping the system chamber to a certain degree of vacuum, place the movable portion of Faraday cap 207 under the optical microscope, using a large field of view placing the optical microscope above the center of movable portion, switching to the SEM, disconnecting voltage supply source (not shown) from the cap and connect a measurement monitoring device (as a resistance measurement mode) between the cap and the ground, raising the height target by steps of 50 micron and after this raising determine if the cap is grounded, if so-raise the z-stage by another 100 micron and them start lowering the height target by steps of 10 micron until the cap is not grounded. It is noted that the steps are made using the z-stage high precision mode. This allows to accurately position the inspected sample under the scanning electron microscope. At this point measure the OLC. The lower the z-axis by another 700 micron to provide the operative working distance. It is noted that other values can be used.

Figure 3:
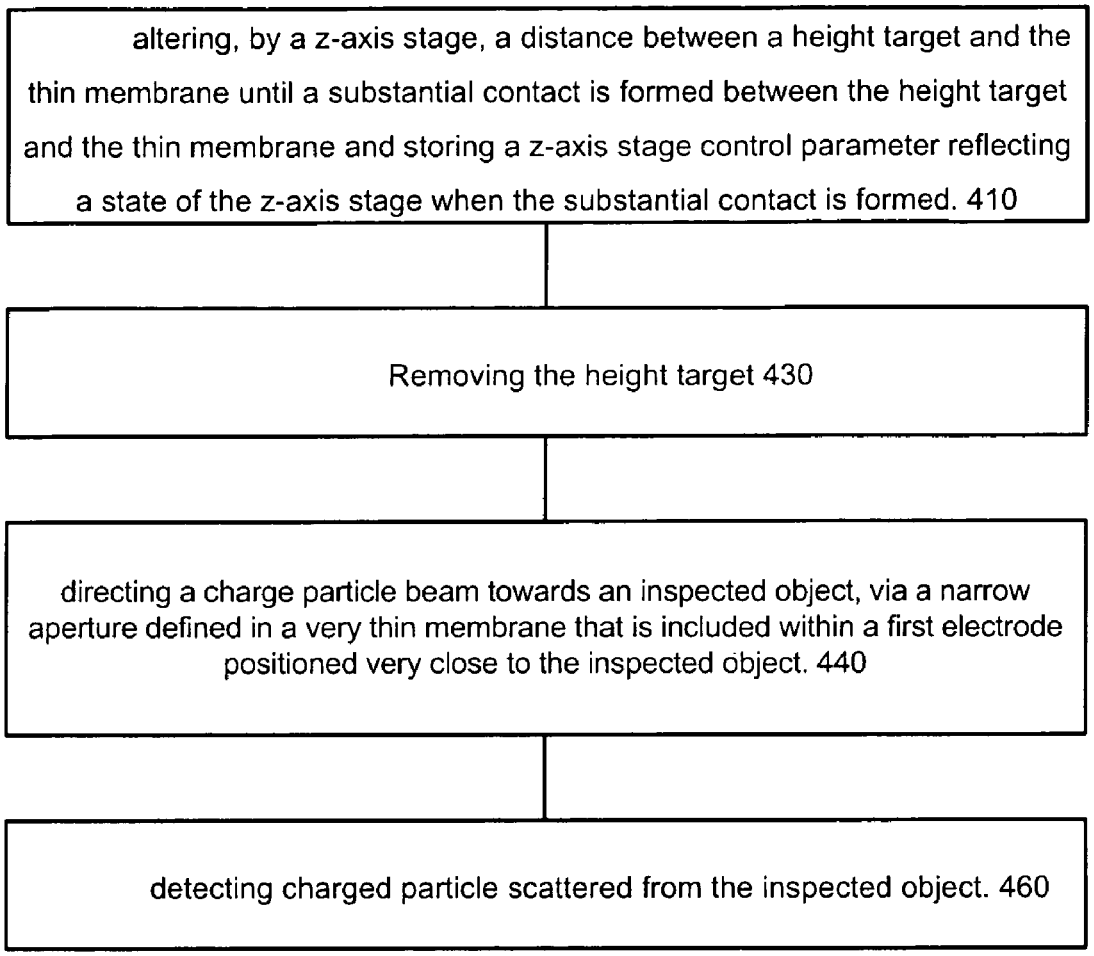
FIG. 3 is a flow chart of a method for illuminating a sample, according to an embodiment of the invention.

FIG. 3 is a flow chart of a method 400 for detecting charged particles, according to an embodiment of the invention.

Method 400 starts by stage 410 of altering, by a z-axis stage, a distance between a height target and the thin portion until a substantial contact is formed between the height target and the thin portion and storing a z-axis stage control parameter reflecting a state of the z-axis stage when the substantial contact is formed.

Conveniently, stage 410 includes establishing an initial contact with the height target and then slightly lifting the height target such that a substantial contact is formed. When a substantial contact is established the upper face of the height target is parallel to the first electrode. The contact can be determined by determining that a loop that includes the first electrode and the height target is closed.

Stage 420 is followed by stage 430 of removing or lowering the height target.

Stage 430 is followed by stage 440 of directing a charge particle beam towards an inspected object, via a narrow aperture defined in a very thin portion that is included within a first electrode positioned very close to the inspected object.

Stage 440 is followed by stage 460 of detecting charged particle scattered from the inspected object.

Conveniently, stage 440 includes directing comprises directing the charged particle beam via a thin portion that is thinner than 0.2 mm.

Conveniently, stage 440 includes directing the charged particle beam via an aperture that has a diameter that is smaller than 1 mm.

Those skilled in the art will readily appreciate that various modifications and changes can be applied to the embodiments of the invention as hereinbefore described without departing from its scope as defined in and by the appended claims.

The invention claimed is:

1. A system comprising: a detector adapted to detect charged particles scattered from a sample; a magnetic lens adapted to generate a magnetic field such as to direct a charge particle beam towards a sample and a first electrode positioned very close to an inspected object, wherein the first electrode comprises a very thin portion that defines a narrow aperture through which the charged particle beam can propagate, wherein the thin portion is thicker than 0.2 mm.

2. The system according to claim 1 wherein a diameter of the aperture is smaller than 0.8 mm.

3. The system according to claim 1 wherein the aperture is defined such as to substantially limit electrostatic field leakage from the first electrode towards the sample.

4. The system according to claim 1 wherein the aperture is shaped such as to allow a collection of a substantial amount of charged particle beams generated by an interaction between the sample and the charged particle beam.

5. The system of claim 1, wherein a diameter of the aperture is smaller than 0.8 mm and the aperture is defined such as to substantially limit electrostatic field leakage from the first electrode towards the sample.

6. The system of claim 1, wherein a diameter of the aperture is smaller than 0.8 mm and the aperture is shaped such as to allow a collection of a substantial amount of charged particle beams generated by an interaction between the sample and the charged particle beam.

7. The system of claim 1, wherein the aperture is defined such as to substantially limit electrostatic field leakage from the first electrode towards the sample and is shaped such as to allow a collection of a substantial amount of charged particle beams generated by an interaction between the sample and the charged particle beam.

8. The system of claim 1, wherein a diameter of the aperture is smaller than 0.8 mm, and the aperture is defined such as to substantially limit electrostatic field leakage from the first electrode towards the sample and is shaped such as to allow a collection of a substantial amount of charged particle beams generated by an interaction between the sample and the charged particle beam.

9. A method for detecting charged particle electrons; the method comprising: directing a charged particle beam towards an inspected object, via a narrow aperture defined in a very thin portion that is included within a first electrode positioned very close to the inspected object; and detecting charged particles scattered from the inspected object, wherein the directing comprises directing the charged particle beam via the thin portion that is thicker than 0.2 mm.

10. The method according to claim 9 wherein the directing comprises directing the charged particle beam via the aperture that has a diameter that is smaller than 0.8 mm.

11. The method according to claim 9 further comprising altering, by a z-axis stage, a distance between a height target and the thin portion until a substantial contact is formed between the height target and the thin portion and storing a z-axis stage control parameter reflecting a state of the z-axis stage when the substantial contact is formed.

12. The method according to claim 11 further comprising removing or lowering the height target, and determining a position of the z-axis during an illumination of the inspected object in response to the z-axis stage control parameter.

13. The method of claim 9, wherein the directing comprises directing the charged particle beam via the aperture that has a diameter that is smaller than 0.8 mm, and further comprising altering, by a z-axis stage, a distance between a height target and the thin portion until a substantial contact is formed between the height target and the thin portion and storing a z-axis stage control parameter reflecting a state of the z-axis stage when the substantial contact is formed.

14. The method of claim 13, further comprising removing or lowering the height target, and determining a position of the z-axis during an illumination of the inspected object in response to the z-axis stage control parameter.

15. A system comprising: a detector adapted to detect charged particles scattered from a sample; a magnetic lens adapted to generate a magnetic field such as to direct a charge particle beam towards a sample and an first electrode positioned very close to an inspected object, wherein the first electrode comprises a very thin portion that defines a narrow aperture through which the charged particle beam can propagate, wherein a diameter of the aperture is smaller than 0.8 mm.

16. The system of claim 15, wherein the aperture is defined such as to substantially limit electrostatic field leakage from the first electrode towards the sample.

17. The system of claim 15, wherein the aperture is shaped such as to allow a collection of a substantial amount of charged particle beams generated by an interaction between the sample and the charged particle beam.

18. The system of claim 15, wherein the aperture is defined such as to substantially limit electrostatic field leakage from the first electrode towards the sample, and is shaped such as to allow a collection of a substantial amount of charged particle beams generated by an interaction between the sample and the charged particle beam.

19. A method for detecting charged particle electrons; the method comprising: directing a charged particle beam towards an inspected object, via a narrow aperture defined in a very thin portion that is included within a first electrode positioned very close to the inspected object; and detecting charged particles scattered from the inspected object, wherein the directing comprises directing the charged particle beam via the aperture that has a diameter that is smaller than 0.8 mm.

20. The method according to claim 19 further comprising altering, by a z-axis stage, a distance between a height target and the thin portion until a substantial contact is formed between the height target and the thin portion and storing a z-axis stage control parameter reflecting a state of the z-axis stage when the substantial contact is formed.

21. The method according to claim 20 further comprising removing or lowering the height target, and determining a position of the z-axis during an illumination of the inspected object in response to the z-axis stage control parameter.

22. A method for detecting charge particle electrons; the method comprising: directing a charged particle beam towards an inspected object, via a narrow aperture defined in a very thin portion that is included within a first electrode positioned very close to the inspected object; detecting charged particles scattered from the inspected object; altering, by a z-axis stage, a distance between a height target and the thin portion until a substantial contact is formed between the height target and the thin portion; and storing a z-axis stage control parameter reflecting a state of the z-axis stage when the substantial contact is formed.

23. The method according to claim 22 further comprising removing or lowering the height target, and determining a position of the z-axis during an illumination of the inspected object in response to the z-axis stage control parameter.

* * * * *